United States Patent
Hwang (10) Patent No.: US 9,472,308 B1
(45) Date of Patent: Oct. 18, 2016

(54) SEMICONDUCTOR MEMORY DEVICE AND TEST METHOD THEREOF

(71) Applicant: SK hynix Inc., Gyeonggi-do (KR)

(72) Inventor: Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/930,174

(22) Filed: Nov. 2, 2015

(30) Foreign Application Priority Data

Jun. 1, 2015 (KR) ........................ 10-2015-0077210

(51) Int. Cl.
| | |
|---|---|
| G11C 7/00 | (2006.01) |
| G11C 29/00 | (2006.01) |
| G11C 17/16 | (2006.01) |
| G11C 17/18 | (2006.01) |
| G11C 29/04 | (2006.01) |

(52) U.S. Cl.
CPC ............... *G11C 29/76* (2013.01); *G11C 17/16* (2013.01); *G11C 17/18* (2013.01); *G11C 29/04* (2013.01); *G11C 29/78* (2013.01)

(58) Field of Classification Search
CPC ....... G11C 29/76; G11C 17/16; G11C 17/18; G11C 29/78; G11C 29/04
USPC .......................................... 365/201, 200, 96
See application file for complete search history.

(56) References Cited

U.S. PATENT DOCUMENTS

| | | | | |
|---|---|---|---|---|
| 7,839,707 B2* | 11/2010 | Aakjer | ................. | G11C 17/165 365/200 |
| 8,010,847 B2* | 8/2011 | Oberlaender | ........... | G11C 29/44 714/42 |
| 8,887,012 B2* | 11/2014 | Kwan | ................. | G11C 29/4401 714/723 |
| 8,913,449 B2* | 12/2014 | Chung | ................... | G11C 17/16 365/189.12 |
| 9,019,791 B2* | 4/2015 | Chung | ................. | G11C 29/028 365/148 |

FOREIGN PATENT DOCUMENTS

KR      1020010008482     2/2001

* cited by examiner

*Primary Examiner* — Viet Q Nguyen
(74) *Attorney, Agent, or Firm* — IP & T Group LLP (57) ABSTRACT

A semiconductor memory device includes: a normal cell region having normal cells; a redundancy cell region having first redundancy cells replaced with repair target cells of the normal cells and second redundancy cells which are not replaced with the repair target cells; a fuse unit suitable for programming repair information including replacement information and one of state information and a repair address of the repair target cells; a boot-up unit suitable for outputting the repair information programmed in the fuse unit, resetting the repair information in response to a test control signal, and outputting the reset repair information; an information update unit suitable for generating the test control signal; a test control unit suitable for generating a test address during a redundancy test operation; and a test unit suitable for selectively testing the second redundancy cells in response to the test address.

19 Claims, 7 Drawing Sheets

|  | TM_PKG | USED | DIS | TARGET_TEST |
|---|---|---|---|---|
| NORMAL TEST | 0<br>0<br>0 | 0<br>0<br>1 | 0<br>1<br>X | 0<br>0<br>1 |
| REDUNDANCY TEST | 1<br>1<br>1 | 0<br>0<br>1 | 0<br>1<br>X | 1<br>0<br>0 |

FIG. 8

SEMICONDUCTOR MEMORY DEVICE AND TEST METHOD THEREOF

CROSS-REFERENCE TO RELATED APPLICATIONS

The present application claims priority of Korean Patent Application No. 10-2015-0077210, filed on Jun. 1, 2015, which is incorporated herein by reference in its entirety.

BACKGROUND

1. Field

Exemplary embodiments of the present invention relate to a semiconductor design technology, and more particularly, to a semiconductor memory device including redundancy cells for replacing repair target memory cells.

2. Description of the Related Art

In general, a semiconductor memory device including Double Data Rate Synchronous Dynamic Random Access Memory (DDR SDRAM) has a large number of memory cells. Recently, as the integration degree of semiconductor memory devices increases with the development of process technology, the number of memory cells has been further increased. When a failure occurs in any one of the memory cells, the semiconductor memory device including the memory cell may not perform a desired operation. Thus, the semiconductor memory device must be discarded. Recently, however, with the development in the process technology of semiconductor memory devices, a failure occurs only in a small number of memory cells. Thus, if the entire semiconductor memory device is discarded as a defective product due to the failure in the small number of memory cells, it is very inefficient in terms of the yield of products. To resolve such a concern, the semiconductor memory device additionally includes redundancy memory cells as well as normal memory cells.

The redundancy memory cell may replace a normal memory cell in which a failure occurred (hereafter, referred to as 'repair target memory cell'). More specifically, when a repair target memory cell is accessed during a read/write operation, a redundancy memory cell is accessed instead of the repair target memory cell. Thus, when an address corresponding to the repair target memory cell is inputted, the semiconductor memory device performs an operation for accessing the redundancy memory cell instead of the repair target memory cell. Hereafter, such operation will be referred to as 'repair operation'. Through the repair operation, a normal operation of the semiconductor memory device is guaranteed.

In order to perform the repair operation, the semiconductor memory device requires circuits other than the redundancy memory cells. The circuits may include a repair fuse circuit. The repair fuse circuit includes a plurality of fuses for storing an address corresponding to a repair target memory cell. Hereafter, the address will be referred to as 'repair target address'. Each fuse is programmed with a bit of a repair target address. At this time, programming indicates a series of operations for storing state information in a fuse. For example, programming may indicate an operation of storing a bit of a repair target address in a fuse. The semiconductor memory device performs a repair operation on a defective memory cell (i.e., a repair target memory cell), using repair target addresses programmed in a plurality of fuses.

The method for programming state information in a fuse may be divided into a physical method and an electrical method.

The physical method cuts a fuse by blowing the fuse using a laser beam according to state information to be programmed. The fuse is referred to as a physical type fuse. Since the fuse is cut by a laser beam, the fuse may also be referred to as a laser blowing type fuse. The physical type fuse can perform a programming operation in a wafer state before a semiconductor memory device is packaged, but cannot perform a programming operation in a package state.

The electrical method changes the connection state of a fuse by applying an over-current to the fuse according to state information to be programmed. The fuse is referred to as an electrical type fuse. The electrical type fuse may include an anti-type fuse and a rupture type fuse. The anti-type fuse changes an open state to a short state, and the rupture type fuse changes a short state to an open state, The electrical type fuse can perform a program ing operation even in a package state, unlike the physical type fuse.

A semiconductor memory device passes through a large number of test operations before the semiconductor memory device is commercialized, and only those that pass through all of the test operations are sold to a consumer. The test operations verify whether a test target circuit (e.g., a semiconductor memory device) operates normally. The test operations are conducted at each of the fabrication steps such that a failure which occurs at a particular fabrication step can be detected immediately, thereby preventing the addition of unnecessary fabrication costs. Thus, it is very important to detect a failure at the initial stage of the fabrication process.

At the package step, a test operation for normal memory cells and redundancy memory cells is performed. This operation includes a normal test operation for the normal memory cells and a redundancy test operation for the redundancy memory cells. The normal test operation can be performed on both the normal memory cells, and the redundancy memory cells that are replaced with repair target memory cells included in the normal cell region. Thus, during the redundancy test operation, another test may be performed on the redundancy memory cells that are replaced with the repair target memory cells. As test stress increases due to the duplicate tests on the redundancy memory cells replaced with the repair target memory cells, a stress imbalance between the cells may occur.

SUMMARY

Various embodiments are directed to a semiconductor memory device capable of preventing duplicate test operations for redundancy cells that are replaced with repair target memory cells.

Further, various embodiments are directed to a semiconductor memory device capable of selectively testing only available cells of redundancy cells that are not replaced with the repair target memory cells, during a redundancy test operation.

In an embodiment, a semiconductor memory device may include: a normal cell region having normal cells; a redundancy cell region having first redundancy cells which are replaced with repair target cells of the normal cells and second redundancy cells which are not replaced with the repair target cells; a fuse unit suitable for programming repair information including replacement information and one of state information and a repair address of the repair target cells; a boot-up unit suitable for performing a boot-up operation to output the repair information programmed in the fuse unit, resetting the repair information based on a test control, signal, and performing a reboot-up operation to output the reset repair information; an information update unit suitable for generating the test control signal based on the replacement information and the state information which are outputted through the boot-up operation; a test control unit suitable for generating a test address based on the reset repair information outputted through the reboot-up operation, during a redundancy test operation; and a test unit suitable for selectively testing the second redundancy cells based on the test address.

In an embodiment, a test method of a semiconductor memory device may include: performing a first test operation to determine replacement information of first redundancy cells which are replaced with repair target cells and second redundancy cells which are not replaced with the repair target cells; programming repair information including the replacement information and one of state information and a repair address of the repair target cells, to a fuse unit, the state information indicating whether the second redundancy cells are available or disabled; performing a boot-up operation to output the repair information programmed in the fuse unit; generating the test control signal based on the replacement information and the state information, and resetting the repair information based on the test control signal; performing a reboot-up operation to output the reset repair information; and performing a redundancy test operation of selectively testing the second redundancy cells based on the reset repair information.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 1A:
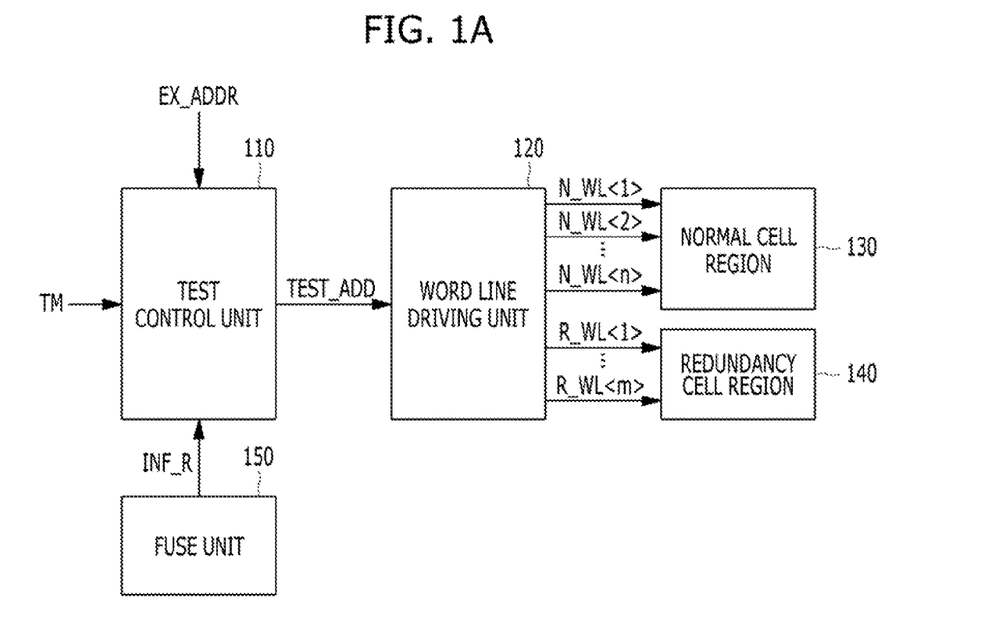
FIG. 1A is a block diagram illustrating a semiconductor memory device.

FIG. 1A is a block diagram illustrating a semiconductor memory device. FIG. 1A does not illustrate components related to a normal operation, but illustrates components corresponding to a test operation.

Referring to FIG. 1A, the semiconductor memory device may include a test control unit 110, a word line driving unit 120, a normal cell region 130, a redundancy cell region 140, and a fuse unit 150.

The fuse unit 150 may serve to program an address corresponding to a repair target word line (e.g., a repair target address) to a storage circuit thereof. The fuse unit 150 may output the programmed repair target address as repair information INF_R to the test control unit 110.

The test control unit 110 generates a test address TEST_ADD in response to an external address EX_ADDR inputted from outside during a test operation. The test control unit 110 also generates the test address TEST_ADD by comparing the external address EX_ADDR with the repair information INF_R.

The word line driving unit 120 generates a plurality of normal word line driving signals N_WL<1:n> and a plurality of redundancy word line driving signals R_WL<1:m> for performing an active operation on a plurality of normal word lines and a plurality of redundancy word lines in response to the test address TEST_ADD.

The normal cell region 130 may include a plurality of normal memory cells. The normal memory cells may be coupled to the normal word lines. When a normal word line is activated, a read/write operation for normal memory cells coupled to the normal word line is performed.

The redundancy cell region 140 may include a plurality of redundancy memory cells. The redundancy memory cells may be coupled to the redundancy word lines. When a redundancy word line is activated, a read/write operation for redundancy memory cells coupled to the redundancy word line may be performed. For convenience of description, the case in which the number of the normal word lines is greater than the number of the redundancy word lines will be taken as an example (e.g., n is greater than m).

Figure 1B:
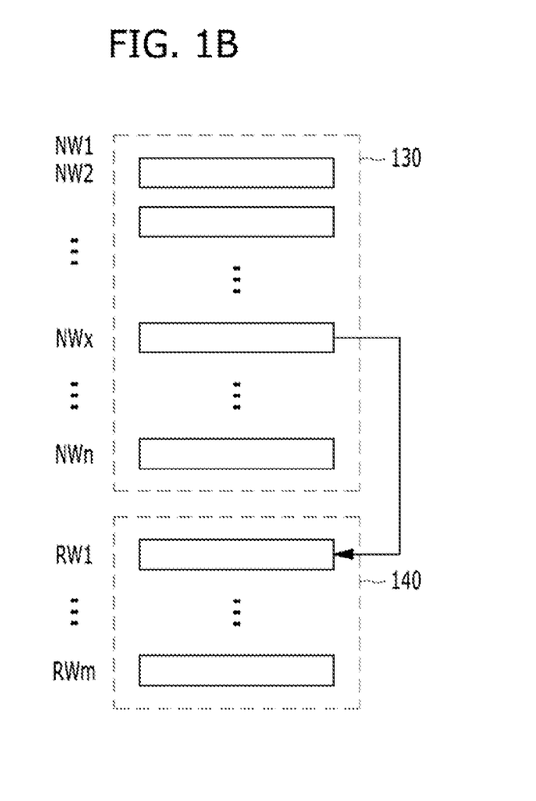
FIG. 1B is a detailed diagram of a normal cell region and a redundancy cell region shown in FIG. 1A.

FIG. 1B is a detailed diagram of the normal cell region 130 and the redundancy cell region 140 shown in FIG. 1A.

Referring to FIG. 1B, when a defective cell (e.g., a repair target memory cell) is detected in the normal cell region 130, a normal word line NWx in which the repair target memory cell is positioned may be replaced with a redundancy word line RW1 of the redundancy cell region 140. For this operation, the test control unit 110 generates a test address TEST_ADD to activate the redundancy word line RW1 instead of the normal word line NWx in which the 110 repair target memory cell is positioned, when the external address EX_ADDR coincides with the repair information INF_R. Thus, when the repair target memory cell is accessed during a test operation, a redundancy memory cell may be internally tested through a repair operation, instead of the repair target memory cell.

In one example of a test operation, the operation is divided into a test operation for detecting a repair target address and a test operation performed after the repair target address is programmed. The test operation for detecting a repair target address will be referred to as a first test operation and the test operation performed after the repair target address is programmed will be referred to as a second test operation.

During the first test operation, the test control unit 110 generates the test address TEST_ADD in response to the external address EX_ADDR. The word line driving unit 120 sequentially activates the normal word line signals N_WL<1:n> in response to the test address TEST_ADD. Then, the word line driving unit 120 sequentially activates the redundancy word line signals R_WL<1:m> in response to the test address TEST_ADD.

A test operator receives test data stored in the normal memory cells and the redundancy memory cells through the active operations on the normal word lines NW<1:n> and the redundancy word lines RW<1:m>, and analyzes the received test data. Then, the test operator may detect a repair target memory cell in which a failure occurred, based on the result of the first test operation, and program a repair target address as repair information INF_R to the fuse unit 150 through a repair operation. Thus, a redundant path may be formed between the repair target memory cell and the redundancy memory cell.

During the second test operation, the test control unit 110 generates the test address TEST_ADD in response to the external address EX_ADDR, and the word line driving unit 120 performs a normal test operation for testing the normal cell region 130 in response to the test address TEST_ADD. When the input external address EX_ADDR coincides with the repair target address corresponding to the repair information INF_R, the test control unit 110 generates the test address TEST_ADD to activate the redundant path. Thus, the word line driving unit 120 activates the redundancy word line RW1 replaced with the repair target memory cell through the redundant path, instead of activating the normal word line NWx corresponding to the repair target address among the normal word lines NW<1:n>.

Through the above process, the word line driving unit 120 not only tests the normal memory cells, but also tests a part of redundancy memory cells replaced with the repair target memory cells among the redundancy memory cells through the redundant path.

Then, the word line driving unit 120 performs a redundancy test operation for testing the redundancy cell region 140 in response to the test address TEST_ADD. During the redundancy test operation, the redundancy word lines RW<1:m> may be activated once to test the redundancy memory cells.

Furthermore, the normal memory cells and redundancy memory cells which are not replaced with the repair target memory cells may be tested once through a normal test operation and a redundancy test operation, respectively. The redundancy memory cells replaced with the repair target memory cells through the redundant path may be tested twice through the normal test operation and the redundancy test operation. Such duplicate tests may increase test stress, and thus, a stress imbalance may occur between the memory cells.

The redundancy memory cells which are not replaced with the repair target memory cells may include memory cells which are disabled due to defects or the like. According to the above-described method, however as the test operation is performed on the entire redundancy cell region 140 regardless of whether the disabled memory cells are present, the test time inevitably increases.

Hereafter, a semiconductor device in accordance with an embodiment of the present invention will be described with reference to the drawings. An embodiment of a test operation will be used for describing the configuration and operation of the semiconductor device. The descriptions of the test operation will be focused on a redundancy test operation for testing a redundancy cell region.

Figure 2:
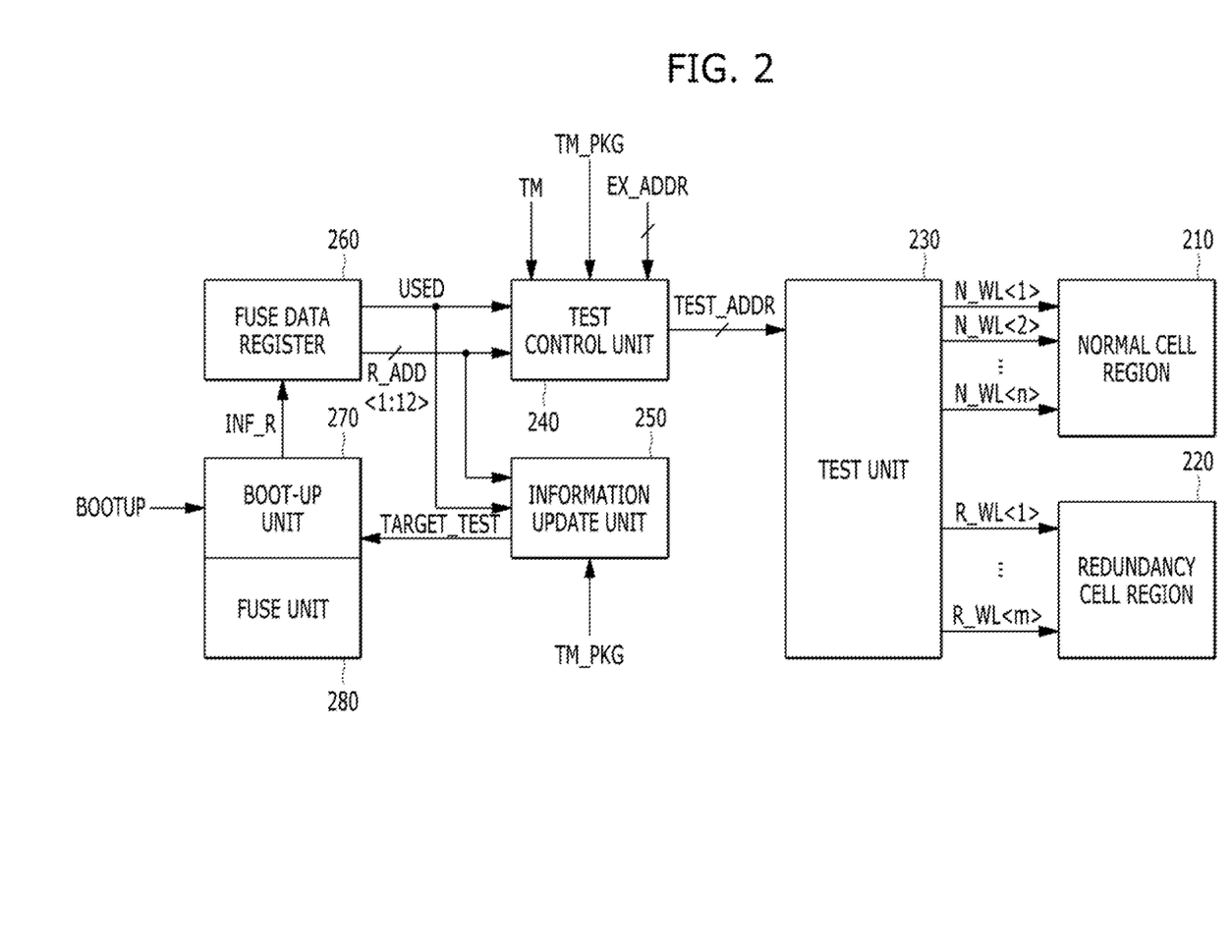
FIG. 2 is a block diagram illustrating a semiconductor memory device in accordance with an embodiment of the present invention.

FIG. 2 is a block diagram illustrating a semiconductor memory device in accordance with an embodiment of the present invention.

Referring to FIG. 2, the semiconductor memory device includes a normal cell region 210, a redundancy cell region 220, a test unit 230, a test control unit 240, an information update unit 250, a fuse data register 260, a boot-up unit 270, and a fuse unit 280.

The normal cell region 210 may include a plurality of normal cells.

The redundancy cell region 220 may include first redundancy cells replaced with repair target cells among the normal cells and second redundancy cells which are not replaced with the repair target cells.

The fuse unit 280 may include a plurality of fuses (not illustrated) for programming repair information INF_R corresponding to the first and second redundancy cells. The repair information INF_R may include replacement information USED (see FIG. 3) indicating whether the first and second redundancy cells were replaced with repair target cells. Furthermore, the repair information INF_R may include state information DIS (see FIG. 5) or a repair address R_ADD<1:12> of the repair target cells according to the replacement information USED. Herein, the state information DIS may indicate whether the second redundancy cells are available or disabled. For example, the fuse unit 280 may program the replacement information USED and the repair address R_ADD<1:12> for the first redundancy cells, and program the replacement information USED and a part of the repair address R_ADD<1:12> corresponding to the state information DIS, e.g., a state bit address R_ADD<2:3> for the second redundancy cells.

The fuse unit 280 may also include first and second fuse groups (not illustrated). The first fuse group corresponds to the first redundancy cells, and programs the replacement information USED and the repair address R_ADD<1:12>. The second fuse group corresponds to the second redundancy cells, and programs the replacement information USED and the part of the repair address R_ADD<1:12> corresponding to the state information DIS (i.e., the state bit address R_ADD<2:3>).

The fuse unit 280 may include electrical type fuses, such as anti-type fuses or blowing type fuses, which may be programmed even after a package step. Alternatively, the fuse unit 280 may include an array E-fuse (ARE) having unit fuse cells arranged in an array form.

The boot-up unit 270 performs a boot-up operation to output the repair information INF_R programmed in the fuse unit 280 in response to a boot-up signal BOOTUP. Furthermore, the boot-up unit 270 resets repair information INF_R having new values updated from the repair information programmed in the fuse unit 280, in response to a test control signal TARGET_TEST provided from the information update unit 250, and then performs a reboot-up operation to output the reset repair information INF_R to the fuse data register 260 in response to the boot-up signal BOOTUP.

The fuse data register 260 stores the repair information INF_R outputted from the boot-up unit 270, provides the replacement information USED and the repair address R_ADD<1:12> to the test control unit 240, and provides the replacement information USED and the state bit address R_ADD<2:3> to the information update unit 250.

The information update unit 250 generates the test control signal TARGET_TEST in response to the replacement information USED and the state bit address R_ADD<2:3> which are provided from the fuse data register 260, through the boot-up operation of the boot-up unit 270.

The test control unit 240 generates a test address TEST_ADD in response to an external address EX_ADDR inputted from outside during a test operation. During a normal test operation, the test control unit 240 compares the external address EX_ADDR with the replacement information USED and the repair address R_ADD<1:12> which are provided from the fuse data register 260, and generates the test address TEST_ADD corresponding to a plurality of normal word lines. During a redundancy test operation, the test control unit 240 generates a test address TEST_ADD corresponding to a plurality of redundancy word lines in response to the replacement information USED and the repair address R_ADD<1:12> which are provided from the fuse data register 260 through the reboot-up operation of the boot-up unit 270.

The test unit 230 tests the normal cell region 210 and the redundancy cell region 220 in response to the test address TEST_ADD. In response to the test address TEST_ADD, the test unit 230 tests the normal cells and the first redundancy cells during the normal test operation, and tests the second redundancy cells during the redundancy test operation. In particular, the test unit 230 may selectively test only available cells among the second redundancy cells during the redundancy test operation. The test unit 230 may include a word line driving unit or column line driving unit.

Figure 3:
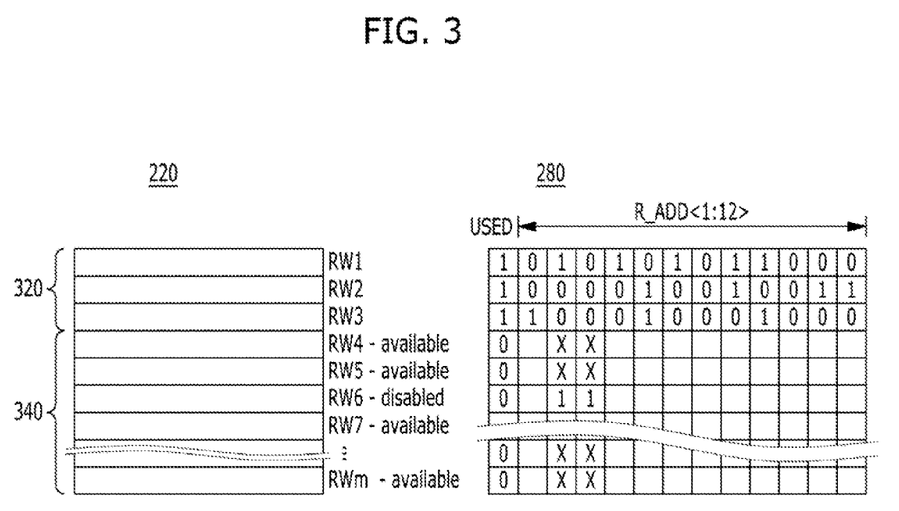
FIG. 3 is a detailed diagram for describing a redundancy cell region and a fuse unit shown in FIG. 2.

FIG. 3 is a detailed diagram of the redundancy cell region 220 and the fuse unit 280 shown in FIG. 2.

Referring to FIG. 3 the redundancy cell region 220 may include first redundancy cells 320 replaced with repair target cells among normal cells and second redundancy cells 340 which are not replaced with the repair target cells. The redundancy cells formed in the redundancy cell region 220 correspond one-to-one to fuses formed in the fuse unit 280.

The second redundancy cells 340 may include available cells and disabled cells. The available cells of the second redundancy cells 340 replace repair target cells which will be additionally detected for a subsequent operation. During a redundancy test operation, the available cells are set to a test target, but the disabled cells may be excluded from the test target.

The fuse unit 280 programs the replacement information USED indicating whether corresponding redundancy cells were replaced with repair target cells. Furthermore, when a corresponding redundancy cell is determined to be the first redundancy cell 320 according to the replacement information USED, the fuse unit 280 programs the repair address R_ADD<1:12>, and when the corresponding redundancy cell is determined to be the second redundancy cell 340 according to the replacement information USED, the fuse unit 280 programs the state bit address R_ADD<2:3> for determining the test target. The state bit address R_ADD 2:3> may then be programmed using a part of the repair address R_ADD<1:12>. For example, when the replacement information USED is set to a logic high level indicating that the redundancy cells were replaced with the repair target cells (e.g., when the redundancy cells are determined to be the first redundancy cells 320) the data stored in the fuse unit 280 indicates the repair address R_ADD<1:12>. Furthermore, when the replacement information USED is set to a logic high level indicating that the redundancy cells were not replaced with the repair target cells (e.g., when the redundancy cells are determined to be the second redundancy cells 340) the data stored in the fuse unit 280 indicates the state bit address R_ADD<2:3>. In an embodiment of the invention, the disabled cells of the second redundancy cells 340 are excluded from the test target and not tested during the redundancy test operation. For this operation, suppose that the state bit address R_ADD<2:3> is set to '11'.

Furthermore, the state bit address R_ADD<2:3> may be configured with the second and third bits of the repair address R_ADD<1:12>. However, the present invention is not limited thereto, as one of skill in the art will recognize the state bit address may include more bits or less bits.

Figure 4:
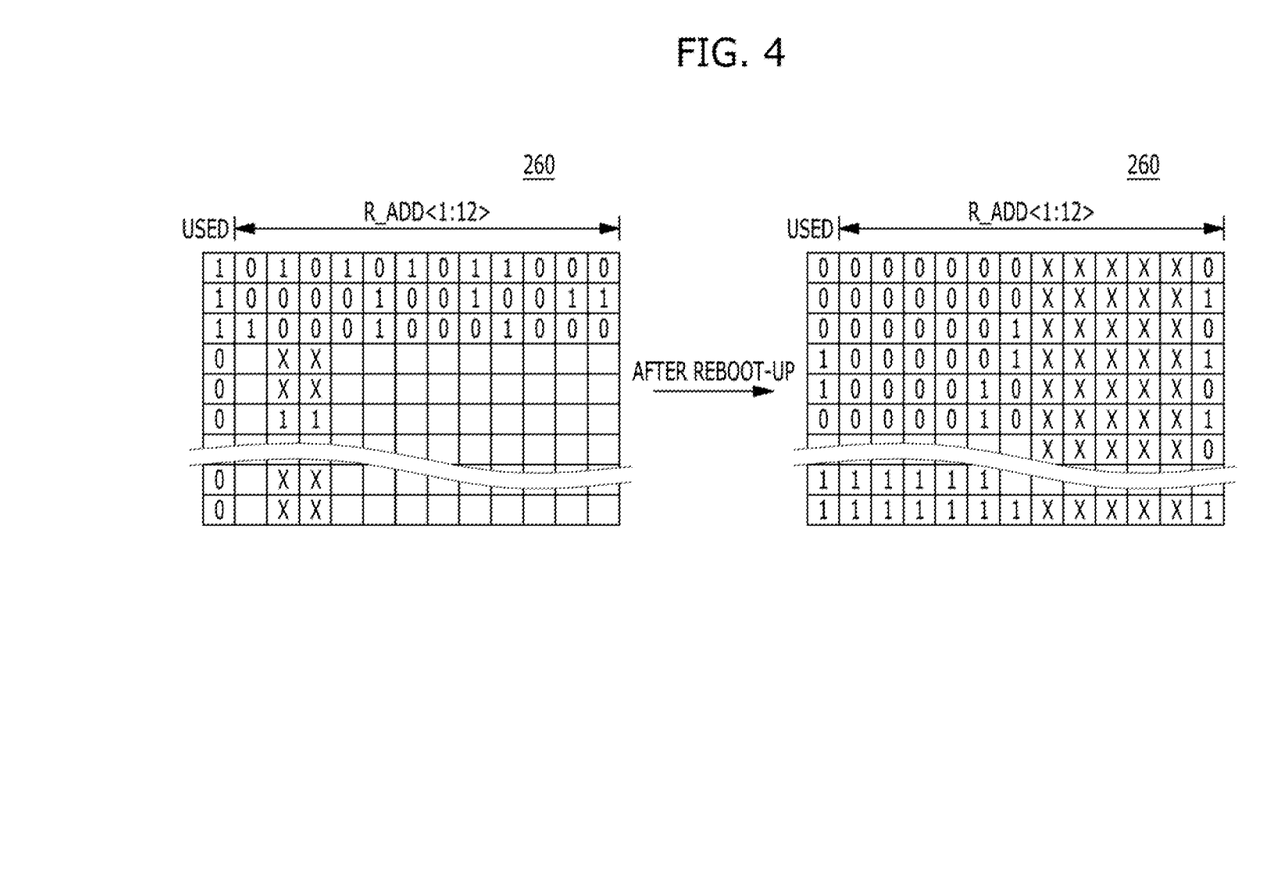
FIG. 4 is a detailed diagram for describing repair information updated in a fuse data register shown in FIG. 2, after a reboot-up operation.

FIG. 4 is a detailed diagram depicting the repair information INF_R updated in the fuse data register 260 shown in FIG. 2 after the reboot-up operation of the boot-up unit 270.

The boot-up unit 270 resets repair information INF_R having new values updated from the repair information programmed in the fuse unit 280 in response to the test control signal TARGET_TEST, and then performs the reboot-up operation to output the reset repair information INF_R (right one of FIG. 4) instead of the repair information INF_R (left one of FIG. 4) programmed in the fuse unit 280 in response to the boot-up signal BOOTUP.

During the redundancy test operation the information updated in the fuse data register 260 after the reboot-up operation may be configured as illustrated in FIG. 4.

Referring to FIG. 4, the boot-up unit 270 resets repair information INF_R (right one of FIG. 4) to have new replacement information USED which is reset using the test control signal TARGET_TEST, and the repair address R_ADD<1:12> which is designated to map the entire redundancy cell region 220. Further, the boot-up unit 270 outputs the reset repair information INF_R to the fuse data register 260 in response to the boot-up signal BOOTUP.

The test control signal TARGET_TEST is generated in such a manner that the disabled cells of the second redundancy cells 340 are excluded from the test target and only the available cells of the second redundancy cells 340 are set to the test target, during the redundancy test operation. When the new replacement information USED is set to a logic high level, it may indicate that the corresponding redundancy cells are set to the test target. When the new replacement information USED is set to a logic low level, it may indicate that the corresponding redundancy cells are excluded from the test target.

Furthermore, when 8K normal cell regions and 128 redundancy cell regions are provided, seven bits R_ADD<1: 6, 12> of the repair address R_ADD<1:12> may be used to map the entire 128 redundancy cell regions. For example, the repair addresses R_ADD<1:12> corresponding to the first to 128th redundancy cell regions may be mapped to "000000XXXXX0, 000000XXXXX1, 000001XXXXX0, 000001XXXXX1, . . . , and 111111XXXXX1."

As described above, during the redundancy test operation, the test control unit 240 may set the test address TEST_ADDR according to the repair information INF_R which is newly set in the fuse data register 260. The test address TEST_ADD is then generated in such a manner that the disabled cells of the second redundancy cells 340 are excluded from the test target and only the available cells of the second redundancy cells 340 are set to the test target.

Figure 5:
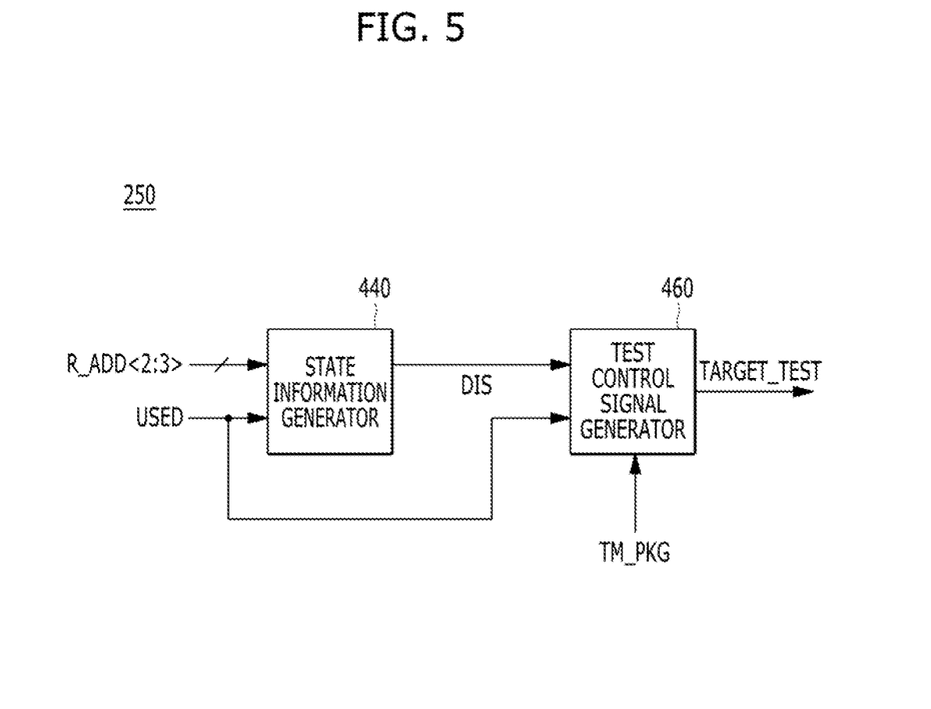
FIG. 5 is a detailed diagram of an information update unit shown in FIG. 2.

FIG. 5 is a detailed diagram of the information update unit 250 shown in FIG. 2.

Referring to FIG. 5, the information update unit 250 may include a state information generator 440 and a test control signal generator 460.

The state information generator 440 generates the state information DIS in response to the replacement information USED and the state bit address R_ADD<2:3>. When corresponding redundancy cells were replaced with repair target cells (e.g., when the corresponding redundancy cells are the first redundancy cells 320) the state information generator 440 fixes the state information DIS to a predetermined level, regardless of the state bit address R_ADD<2:3>. Furthermore, when corresponding redundancy cells were not replaced with repair target cells (e.g., when the corresponding redundancy cells are the second redundancy cells 340) the state information generator 440 determines the state information DIS according to the state bit address R_ADD<2:3>.

The test control signal generator 460 outputs the test control signal TARGET_TEST according to the redundancy test mode signal TM_PKG, the state information DIS, and the replacement information USED. During the redundancy test operation, the test control signal generator 460 generates the test control signal TARGET_TEST such that the disabled cells of the second redundancy cells 340 are excluded from the test target and only the available cells of the second redundancy cells 340 are set to the test target.

Figure 6A:
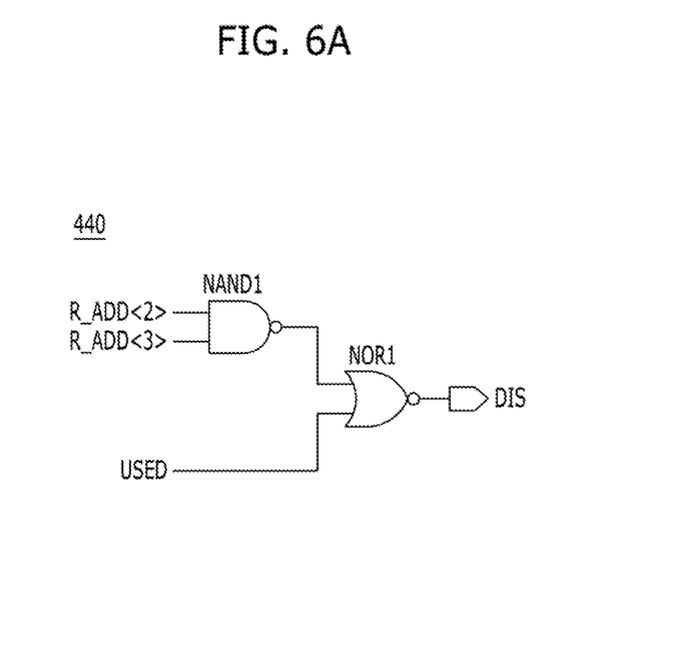
FIG. 6A is a detailed diagram of a state information generator shown in FIG. 5.
Figure 6B:
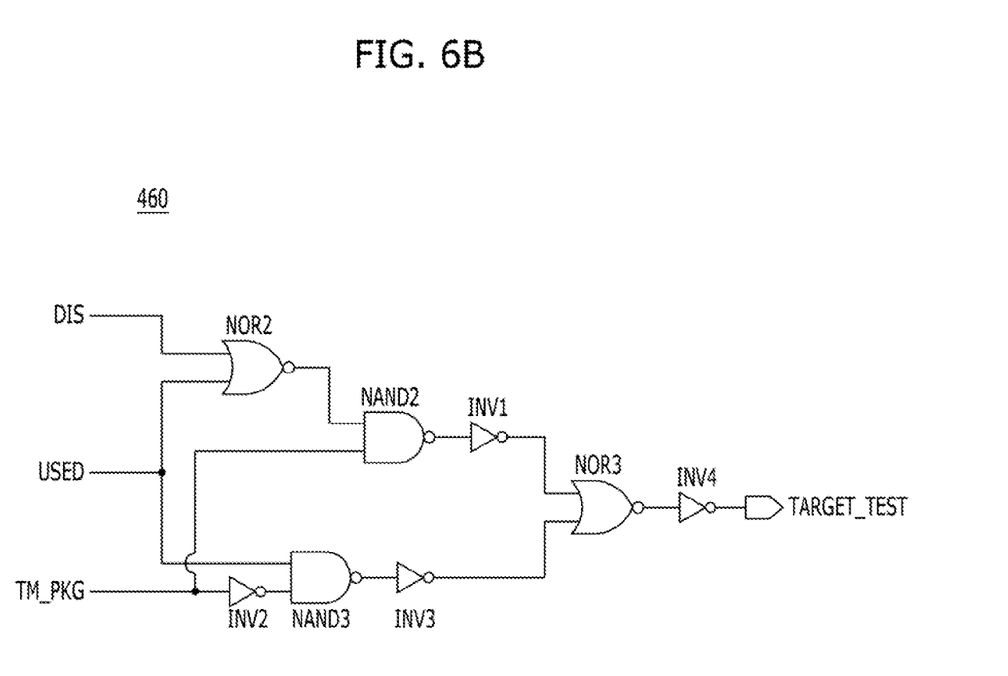
FIG. 6B is a detailed diagram of a test control signal generator shown in FIG. 5.

FIG. 6A is a detailed diagram of the state information generator 440 shown in FIG. 5, and FIG. 6B is a detailed diagram of the test control signal generator 460 shown in FIG. 5.

Referring to FIG. 6A, the state information generator 440 may include a first NAND gate NAND1 and a first NOR gate NOR1. The first NAND gate NAND1 performs a NAND operation on the state bit address R_ADD<2:3>. The first NOR gate NOR1 performs a NOR operation on an output of the first NAND gate NAND1 and the replacement information USED, and output the state information DIS.

When the replacement information USED is set to a logic high level indicating that corresponding redundancy cells are the first redundancy cells 320, the state information generator 440 fixes the state information DIS to a logic low level, regardless of the state bit address R_ADD<2:3>. Furthermore, when the replacement information USED is set to a logic low level indicating that corresponding redundancy cells are the second redundancy cells 340, the state information generator 440 outputs the state information DIS according to the state bit address R_ADD<2:3>. In particular, when the state bit address R_ADD<2:3> is set to '11' (e.g., only when the corresponding cells are disabled cells of the second redundancy cells 340) the state information DIS may be set to a logic high level.

Referring to FIG. 6B, the test control signal generator 460 may include second and third NOR gates NOR2 and NOR3, second and third NAND gates NAND2 and NAND3, and first to fourth inverters INV1 to INV4. The second NOR gate NOR2 performs a NOR operation on the state information DIS and the replacement information USED. The second NAND gate NAND2 and the first inverter INV1 perform an AND operation on an output of the second NOR gate NOR2 and the redundancy test mode signal TM_PKG. The second inverter INV2 inverts the redundancy test mode signal TM_PKG. The third NAND gate NAND3 and the third inverter INV3 perform an AND operation on the replacement information USED and an output signal of the second inverter INV2. The third NOR gate NOR3 and the fourth inverter INV4 perform an OR operation on outputs of the first and third inverters INV1 and INV3 to generate the test control signal TARGET_TEST.

Figure 7:
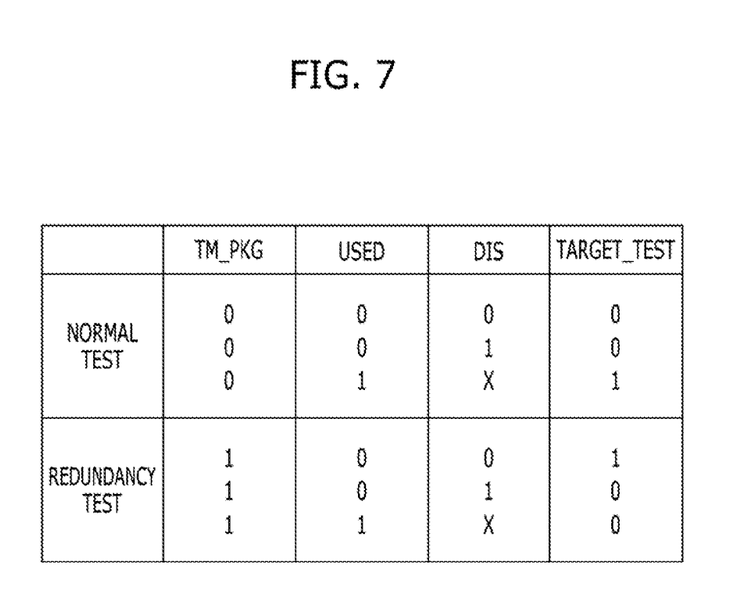
FIG. 7 is a table for describing an operation of the test control signal generator shown in FIG. 5.

FIG. 7 is a table for describing an operation of the test control signal generator 460 shown in FIG. 5.

Referring to FIG. 7, when the test mode signal TM_PKG is activated during the redundancy test operation, the test control signal generator 460 activates the test control signal TARGET_TEST to a logic high level only in case where both of the state information DIS and the replacement information USED are at a logic low level. Thus, the test control signal generator 460 may exclude the disabled cells of the second redundancy cells 340 from the test target, during the redundancy test operation.

Hereafter, referring to FIGS. 2 to 8, the test operation of the semiconductor memory device will be described as follows. The following descriptions will be focused on a redundancy test operation after a package step.

Figure 8:
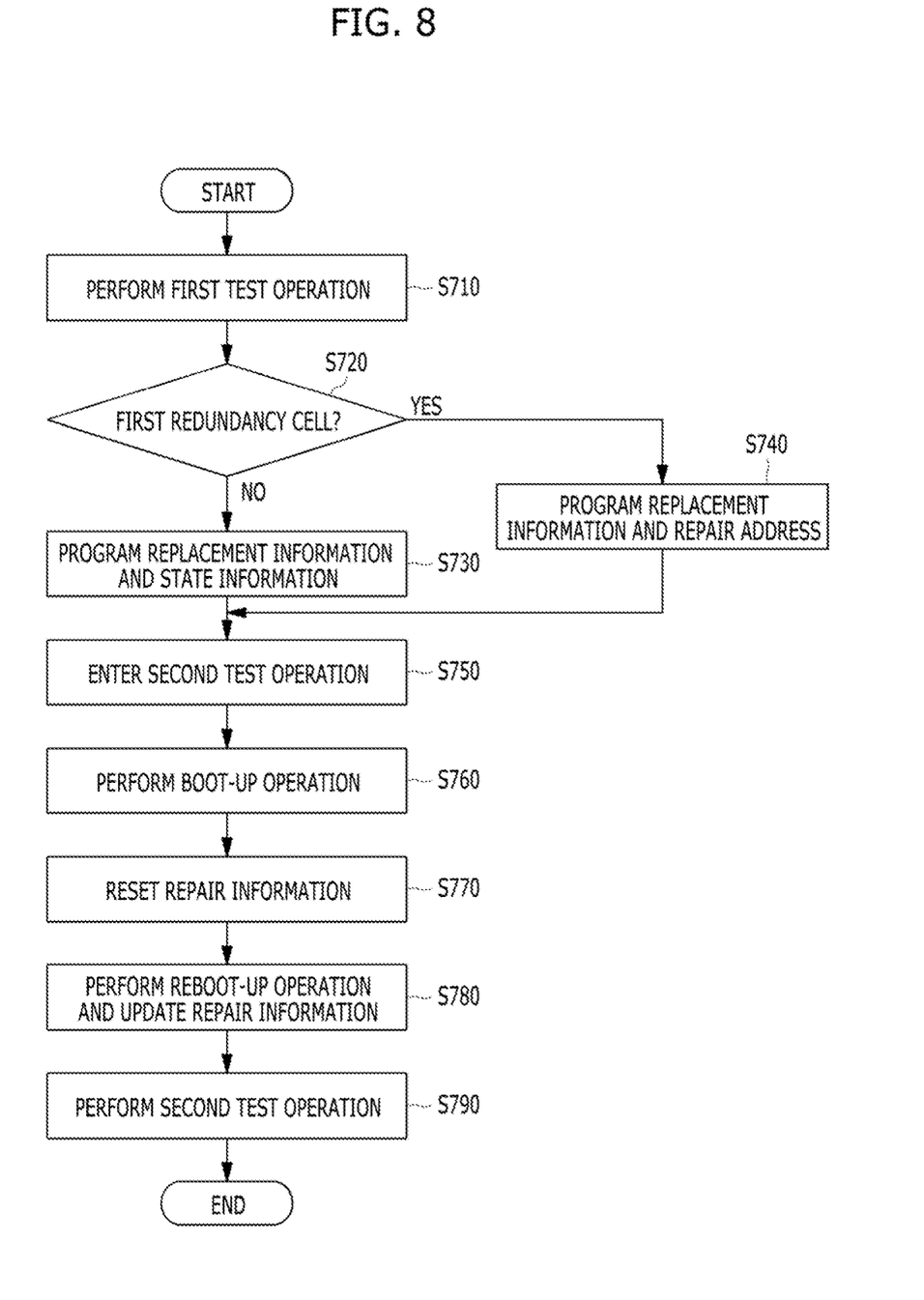
FIG. 8 is a flowchart for describing air operation of the semiconductor memory device shown in FIG. 2.

FIG. 8 is a flowchart for describing an operation of the semiconductor memory device shown in FIG. 2.

In an embodiment, a test operation is divided into a test operation for detecting a repair target address (hereafter, referred to as 'first test operation') and a test operation performed after the repair target address is programmed (hereafter, referred to as 'second test operation').

The first test operation may be performed at a wafer state or package state, and the second test operation may be performed after the package state at which the repair target address is detected to perform a repair operation.

The first test operation is performed in response to a test mode signal TM at step S710. When entering the first test operation, the test unit 230 sequentially activates the normal word line driving signals N_WL<1:n>, and sequentially activates the redundancy word line driving signals R_WL<1:m> in response to a test address TEST_ADD. A test operator receives test data stored in the normal cell region 210 and the redundancy cell region 220 through active operations on the normal word lines and the redundancy word lines, and analyzes the received test data. Then, the test operator detects a repair target memory cell in which a failure occurred based on the result of the first test operation, and programs a repair address R_ADD<1:12> as repair information INF_R to the fuse unit 280 through a repair operation. Thus, a redundant path is formed between the repair target memory cell and the redundancy memory cell.

The repair information INF_R may include the replacement information USED indicating whether redundancy cells of the redundancy cell region 220 are the first redundancy cells 320 replaced with the repair target cells or the second redundancy cells 340 which are not replaced with the repair target cells. Furthermore, when it is determined at step S720 that the redundancy cells are the first redundancy cells 320 according to the replacement information USED, the fuse unit 280 programs the replacement information USED and the repair address R_ADD<1:12> at step S740. When it is determined at step S720 that the redundancy cells are the second redundancy cells 340 according to the replacement information USED, the fuse unit 280 programs the replacement information USED and the state bit address R_ADD<2:3> corresponding to the state information DIS at step S730. In one embodiment, the repair information INF_R stored in the fuse unit 280 is configured as illustrated in FIG. 3, although other suitable configurations will be understood by those of skill in the art from the disclosure herein.

Then, at the package state, the fuse unit 280 enters the second test operation in response to the redundancy test mode signal TM_PKG at step S750. In the example described below, the second test operation is the redundancy test operation.

The boot-up unit 270 performs a boot-up operation to output the repair information INF_R programmed in the fuse unit 280 in response to the boot-up signal BOOTUP at step S760.

After the boot-up operation, the fuse data register 260 stores the repair information INF_R outputted from the boot-up unit 270, and provides the replacement information USED and the state bit address R_ADD<2:3> to the information update unit 250. Then as the redundancy test mode signal TM_PKG is activated, the information update unit 250 generates the test control signal TARGET_TEST in response to the replacement information USED and the state bit address R_ADD<2:3>. More specifically, the information update unit 250 generates the test control signal TARGET_TEST such that only available cells of the second redundancy cells 340 are set to the test target.

The boot-up unit 270 resets repair information INF_R having new values updated from the repair information programmed in the fuse unit 280, in response to the test control signal TARGET_TEST, at step S770.

Then, the boot-up unit 270 performs a reboot-up operation to output the reset repair information INF_R in response to the boot-up signal BOOTUP, and updates the repair information INF_R in the fuse data register 260, at step S780. In an embodiment, the repair information INF_R updated in the fuse data register 260 after the reboot-up operation is configured as illustrated in FIG. 4.

Then, the test control unit 240 generates a test address TEST_ADDR corresponding to the external address EX_ADDR in response to the repair address R_ADD<1:12> and the updated replacement information USED during the redundancy test operation. The test unit 230 performs the redundancy test operation of selectively testing only the available cells of the second redundancy cells in response to the test address TEST_ADD at step S790.

As described above, the semiconductor memory device in accordance with the embodiment of the present invention may include the first redundancy cells replaced with the repair target cells among the normal cells and the second redundancy cells which are not replaced with the repair target cells, test the normal cells and the first redundancy cells during a normal test operation, and test only the second redundancy cells during a redundancy test operation. Thus, the semiconductor memory device may prevent duplicate tests, thereby reducing test stress and suppressing a stress imbalance between the memory cells.

Furthermore, through the reboot-up operation, the semiconductor memory device may update the replacement information such that the disabled cells of the second redundancy cells which are not replaced with the repair target cells are excluded from the test target. Thus, the semiconductor memory device may selectively test the second redundancy cells, thereby optimizing the test time.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   a normal cell region having normal cells;
   a redundancy cell region having first redundancy cells which are replaced with repair target cells of the normal cells and second redundancy cells which are not replaced with the repair target cells;
   a fuse unit suitable for programming repair information including replacement information and one of state information and a repair address of the repair target cells;
   a boot-up unit suitable for performing a boot-up operation to output the repair information programmed in the fuse unit, resetting the repair information based on a test control signal, and performing a reboot-up operation to output the reset repair information;
   an information update unit suitable for generating the test control signal based on the replacement information and the state information which are outputted through the boot-up operation;
   a test control unit suitable for generating a test address based on the reset repair information outputted through the reboot-up operation, during a redundancy test operation; and
   a test unit suitable for selectively testing the second redundancy cells based on the test address.

2. The semiconductor memory device of claim 1, wherein the replacement information indicates whether the first and second redundancy cells are replaced with repair target cells, and
   the state information indicates whether the second redundancy cells are available or disabled.

3. The semiconductor memory device of claim 2, wherein the fuse unit comprises:
   a first fuse group suitable for programming the replacement information and the repair address, the first fuse group corresponding to the first redundancy cells; and
   a second fuse group suitable for programming the replacement information and the state information, the second fuse group corresponding to the second redundancy cells.

4. The semiconductor memory device of claim 2, wherein the fuse unit comprises an array E-fuse (ARE).

5. The semiconductor memory device of claim 2, further comprising:
   a fuse data register suitable for storing the repair information outputted from the boot-up unit, and providing the stored data to the test control unit and the information update unit.

6. The semiconductor memory device of claim 2, wherein the boot-up unit sets the test control signal to new replacement information, and resets the repair information such that the repair address maps the entire first and second redundancy cell regions.

7. The semiconductor memory device of claim 2, wherein, during the redundancy test operation, the information update unit generates the test control signal such that disabled cells of the second redundancy cells are excluded from a test target and only available cells of the second redundancy cells are set to the test target.

8. The semiconductor memory device of claim 2, wherein the information update unit comprises:
   a state information generator suitable for generating the state information based on the replacement information and a state bit address; and
   a test control signal generator suitable for generating the test control signal based on a redundancy test mode signal, the state information, and the replacement information.

9. The semiconductor memory device of claim 8, wherein the state bit address includes one or more bits of the repair address.

10. The semiconductor memory device of claim 8, wherein the state information generator fixes the state information to a predetermined level regardless of the state bit address, for the first redundancy cells and determines the state information according to the state bit address for the second redundancy cells.

11. The semiconductor memory device of claim 2, wherein, during a normal test operation, the test control unit generates the test address based on the replacement information and the repair address which are outputted through the boot-up operation.

12. The semiconductor memory device of claim 2, wherein the test unit tests the normal cells and the first redundancy cells during a normal test operation.

13. A test method of a semiconductor memory device, comprising:
   performing a first test operation to determine replacement information of first redundancy cells which are replaced with repair target cells and second redundancy cells which are not replaced with the repair target cells;
   programming repair information including the replacement information and one of state information and a repair address of the repair target cells, to a fuse unit, the state information indicating whether the second redundancy cells are available or disabled;
   performing a boot-up operation to output the repair information programmed in the fuse unit;
   generating the test control signal based on the replacement information and the state information, and resetting the repair information based on the test control signal;
   performing a reboot-up operation to output the reset repair information; and
   performing a redundancy test operation of selectively testing the second redundancy cells based on the reset repair information.

14. The test method of claim 13, wherein the replacement information indicates whether the first and second redundancy cells are replaced with repair target cells.

15. The test method of claim 14, wherein the second test operation is performed at a package state.

16. The test method of claim 14, wherein the generating of the test control signal comprises:
   generating the test control signal such that disabled cells of the second redundancy cells are excluded from a test target and only available cells of the second redundancy cells are set to the test target, during the redundancy test operation.

17. The test method of claim 14, wherein the resetting of the repair information comprises:
   setting the test control signal to new replacement information and resetting the repair information such that the repair address maps the entire first and second redundancy cells.

18. The test method of claim 14, further comprising:
   generating a test address based on the replacement information and the repair address which are outputted through the boot-up operation, during a normal test operation.

19. The test method of claim 14, wherein, during a normal test operation, the normal cells and the first redundancy cells are tested.

* * * * *